(12) United States Patent  (10) Patent No.: US 8,638,171 B2
Blednov et al.  (45) Date of Patent: Jan. 28, 2014

(54) RADIOFREQUENCY AMPLIFIER

(75) Inventors: Igor Blednov, Nijmegen (NL); Iouri Volokhine, Nijmegen (NL)

(73) Assignee: NXP, B.V., Eindhoven (NL)

( * ) Notice: Subject to any disclaimer, the term of this patent is extended or adjusted under 35 U.S.C. 154(b) by 33 days.

(21) Appl. No.: 13/314,752

(22) Filed: Dec. 8, 2011

(65) Prior Publication Data

US 2012/0146723 A1    Jun. 14, 2012

(30) Foreign Application Priority Data

Dec. 10, 2010  (EP) ..................................... 10252098

(51) Int. Cl.
*H03F 3/191*  (2006.01)

(52) U.S. Cl.
USPC ............................................ 330/302; 330/66

(58) Field of Classification Search
USPC .................... 330/66, 192, 277, 302
See application file for complete search history.

(56) References Cited

U.S. PATENT DOCUMENTS

| 2,210,028 | A | 8/1940 | Doherty | |
|---|---|---|---|---|
| 6,646,321 | B2 | 11/2003 | Roodnat | |
| 6,731,174 | B2 | 5/2004 | Krvavac | |
| 6,734,728 | B1 * | 5/2004 | Leighton et al. | 330/302 |
| 7,078,976 | B2 | 7/2006 | Blednov | |
| 7,119,623 | B2 * | 10/2006 | Blednov et al. | 330/302 |
| 7,138,872 | B2 | 11/2006 | Blednov | |
| 7,372,334 | B2 * | 5/2008 | Blair et al. | 330/302 |
| 7,443,264 | B2 | 10/2008 | Blednov | |
| 2002/0039038 | A1 | 4/2002 | Miyazawa | |
| 2007/0024358 | A1 | 2/2007 | Perugupalli et al. | |
| 2008/0231373 | A1 * | 9/2008 | Rahman et al. | 330/302 |
| 2010/0026387 | A1 | 2/2010 | Blednov | |
| 2010/0188147 | A1 | 7/2010 | Blednov et al. | |
| 2010/0200979 | A1 | 8/2010 | Blair et al. | |
| 2011/0210786 | A1 | 9/2011 | Blednov | |

OTHER PUBLICATIONS

Pitzalis, O. et al. "Broad-Band Microwave Class-C Transistor Amplifiers", IEEE Trans. on Microwave Theory and Techniques, vol. MTT-21, No. 11, pp. 660-668 (Nov. 1973).
Khanifar, A. et al. "Bias Circuit Topologies for Minimization of RF Amplifier Memory Effects", IEEE 33$^{rd}$ European Microwave Conference, vol. 3, pp. 1349-1352 (Oct. 2003).
Qureshi, J. H. et al. "A Wide-band 20W LMOS Doherty Power Amplifier", 2010 IEEE MIT-S International, Microwave Symposium Digest, pp. 1504-1507 (May 2010).
Extended European Search Report for European Patent Appln. No. 10252098.8 (May 26, 2011).

* cited by examiner

*Primary Examiner* — Khanh V Nguyen

(57) ABSTRACT

The invention relates to high power radiofrequency amplifiers, in particular to amplifiers having output impedance matching networks, exemplary embodiments of which include a radiofrequency amplifier having an active device mounted on a substrate within a device package, the amplifier having an output impedance matching network comprising a high pass network provided at least partly on the active device and a low pass network having a first inductive shunt connection between an output of the active device and a first output lead and a second inductive shunt connection between the output of the active device and a second output lead, wherein part of the second output lead forms an inductance contributing to the inductance of the low pass network.

8 Claims, 14 Drawing Sheets

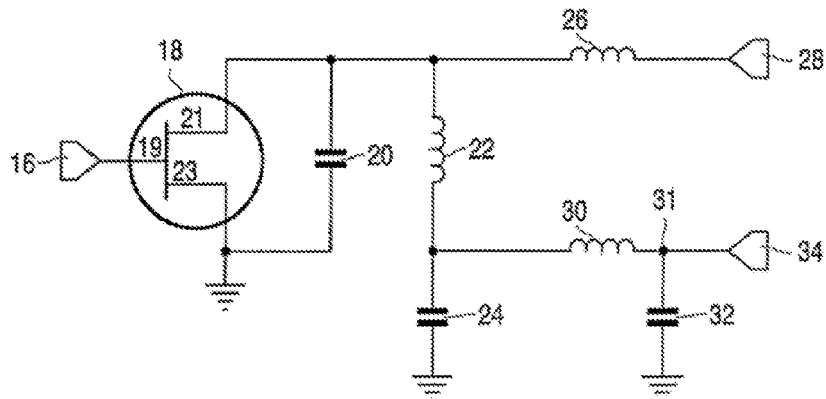
Fig. 1
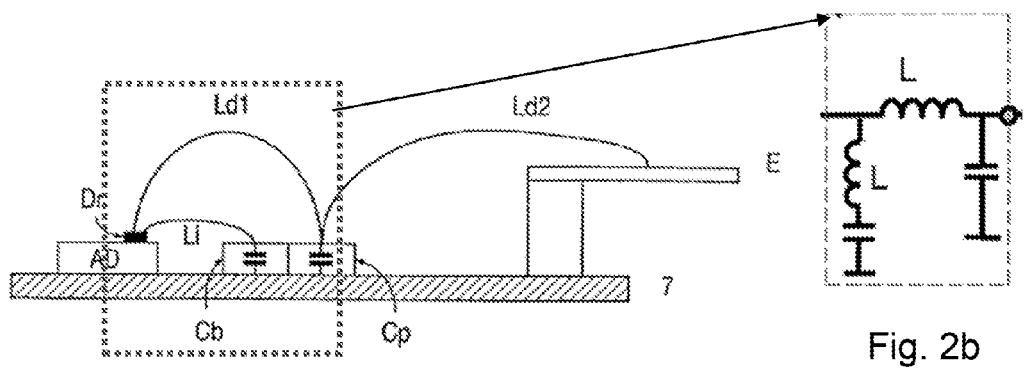
Fig. 2a
Fig. 2b
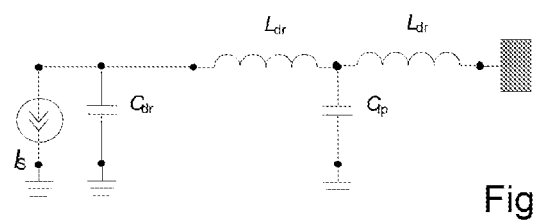
Fig. 3a
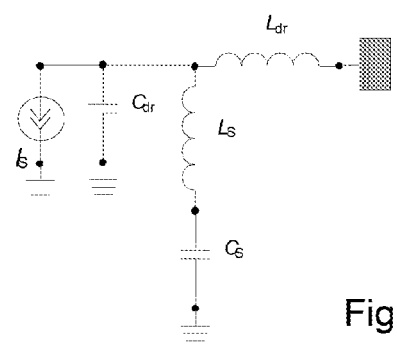
Fig. 3b

RADIOFREQUENCY AMPLIFIER

This application claims the priority under 35 U.S.C. §119 of European patent application no. 10252098.8, filed on Dec. 10, 2010, the contents of which are incorporated by reference herein.

FIELD OF THE INVENTION

The invention relates to high power radiofrequency amplifiers, in particular to such amplifiers comprising output impedance matching networks.

BACKGROUND OF THE INVENTION

High power radiofrequency amplifiers, such as Doherty amplifiers as well as single-ended class AB amplifiers, tend to exhibit memory effects. Memory effects are particularly problematic at frequencies of 1 GHz and above. These memory effects result from parasitic inductances between the power supply and the amplifier and from the speed of variation and magnitude of current consumption by the amplifier, which follows the envelope of the input signal modulation. Such parasitic inductances may exist as part of a power supply network. At higher modulation frequencies larger distortions tend to appear due to such memory effects. Doherty amplifiers tend to exhibit higher memory effects due to operation of the peak amplifier in C-class mode.

The listing or discussion of a prior-published document in this specification should not necessarily be taken as an acknowledgement that the document is part of the state of the art or is common general knowledge.

SUMMARY OF THE INVENTION

In accordance with the invention there is provided a radiofrequency amplifier comprising an active device mounted on a substrate within a device package, the amplifier having an output impedance matching network comprising a series high pass network provided at least partly on the active die and a low pass network comprising a first inductive shunt connection between an output of the active device and a first output lead and a second inductive shunt connection between the output of the active device and a second output lead, wherein a portion of the second output lead forms an inductance contributing to the inductance of the low pass network.

An aspect of the invention is that high inductances are not required inside the device package or on the active device, and therefore losses within the package can be reduced and the overall size of the package minimised.

The amplifier according to the invention has no need for a high value shunt inductance inside the device package, and therefore the number of bond wires connecting the drain of the active device with the second output lead can be greatly increased, which greatly extends the applicability of the invention for high power amplifiers.

The portion of the second output lead may be in the form of a metal strip provided between the first output lead and the active device output.

The portion of the second output lead may alternatively be in the form of a transmission line provided between the first output lead and the active device output.

The use of a post-matching network comprising a high pass network partly provided on the amplifier die with a low pass network provided off the amplifier die allows for a wideband impedance transformation at zero phase shift at central frequency. This avoids any detrimental impedance inversion between the channel (the drain or collector) of the active device and the discrete power device output, and also makes provision of load line modulation conditions easier when operating as a main or peak device in a Doherty amplifier.

The use of such a post-matching network also allows for an improved amplifier having a reduced memory effect and an improved bandwidth. Other aspects may include an improved broad band VBW, low phase rotation, a more compact form and lower loss.

The high pass network may comprise a series capacitor connected to the output of the active device, either between an output connection and a drain connection of the active device or as part of a separate die on the substrate.

BRIEF DESCRIPTION OF THE DRAWINGS

The invention is described in more detail below by way of illustrative exemplary embodiments, with reference to the accompanying drawings in which:

FIG. 1 is a circuit diagram of an output circuit for a power transistor with a compensation circuit;

FIG. 2a is a schematic representation of a post-matching scheme for an active device;

FIG. 2b is an equivalent circuit for a selected part of the post-matching scheme of FIG. 2a;

FIGS. 3a and 3b are schematic circuit diagrams of exemplary post-matching circuits;

DETAILED DESCRIPTION OF EMBODIMENTS

Figure 4A:
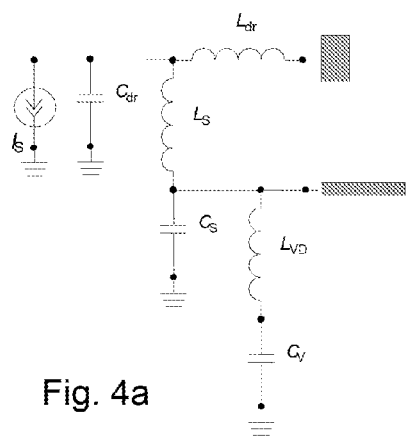
FIGS. 4a, 4b and 4c are schematic circuit diagrams of further exemplary post-matching circuits having additional output leads.
Figure 4B:
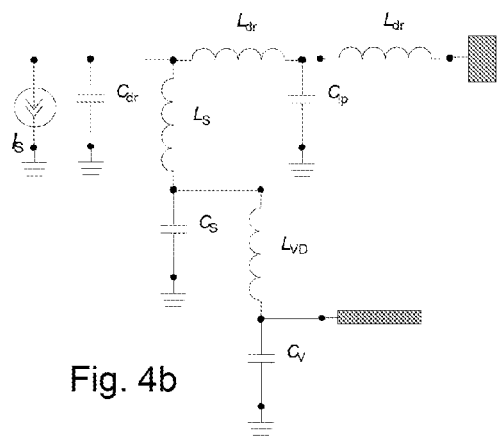
Figure 4C:
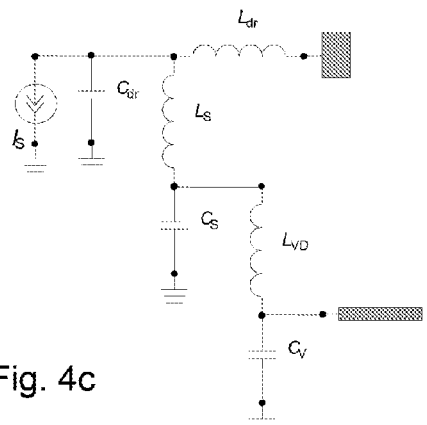

U.S. Pat. No. 7,119,623 discloses output circuits for high power semiconductor amplifier elements, in which inductances and capacitances are configured to compensate for the output capacitance of the semiconductor amplifier. Circuits disclosed in U.S. Pat. No. 7,119,623, an example of which is shown in FIG. 1, provide compensation for the output capacitance 20 of a power transistor 18 through use of a serial circuit connected in parallel comprising inductances 22, 26, 30 and capacitances 24, 32. A power supply lead 34 is connected to a node 31 between inductance 30 and capacitance 32.

In many cases such as disclosed in U.S. Pat. Nos. 7,119,623 and in 6,646,321, internal matching requires lowpass match components inside the device package together with high values of inductances. This is particularly difficult to achieve in small packages at low frequencies (for example below 1 GHz) due to limited space being available within the device package. In addition, attention needs to be paid to the DC power supply, which should feature a low inductance between the drain of the active device and the DC supply. A further issue is that of losses introduced by internal low pass post matching.

FIGS. 3a and 3b illustrate two examples of post match circuits using low pass components.

In some cases, such as in U.S. Pat. No. 7,119,623, additional leads may be provided on the amplifier package to provide an additional connection to an internal capacitor. Exemplary circuits having such additional leads are illustrated in FIGS. 1, 4a, 4b and 4c.

The present invention relates to a high frequency high power transistors provided with a shunt inductor compensating the output capacitance of the power transistor. Such power transistors are generally known and shown in FIG. 3b. They are commonly provided with a post-matching stage formed by the internal shunt inductor $L_s$. The value of the shunt inductor $L_s$ is chosen to form parallel resonance with parasitic output capacitance $C_{dr}$ of the active die. The inductance can be computed with the following equation:

$$L_S = \frac{C_{DC} + C_{OUT}}{4f^2\pi^2 C_{DC} C_{OUT}},$$

where $C_{DC}$ is a DC blocking capacitor, $C_{dr}$ is a parasitic output capacitance, and f is a frequency, usually chosen below the frequency of operation.

At low frequency the value of a shunt inductance $L_s$ can be larger than 1 nH, which is generally not realizable inside a device package with the use of bond wires only. For high power transistors, for example with output powers above 100W, the $L_s$ shunt inductance experiences excessive RF current. To increase the current handling of $L_s$ one needs to increase a number of bond wires, but with an increase in the number of bond wires the overall shunt inductance $L_s$ reduces.

Providing a DC feed via extra leads connected to the DC blocking capacitor $C_{DC}$ of a power transistor such as disclosed in U.S. Pat. No. 7,119,623 improves the video bandwidth (VBW) of the amplifier but adds additional video and DC currents on top of already existing excessive RF currents. Additionally, the internal network comprises extra components in front of the active die, which leads to additional losses limiting efficiency of the amplifier. This limits the applicability of the amplifier in real applications.

First Embodiment

Figure 5A:
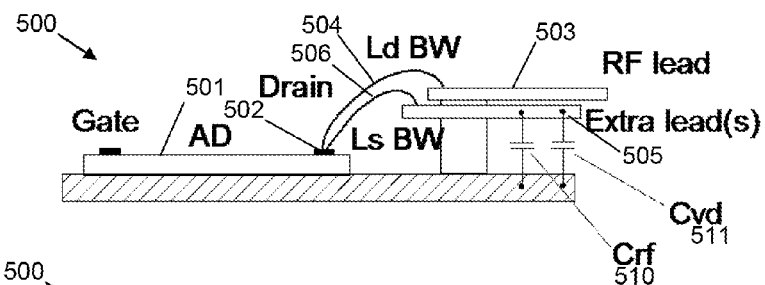
FIGS. 5a, 5b and 5c illustrate an exemplary first embodiment of an amplifier in schematic sectional, circuit diagram and perspective views respectively.
Figure 5B:
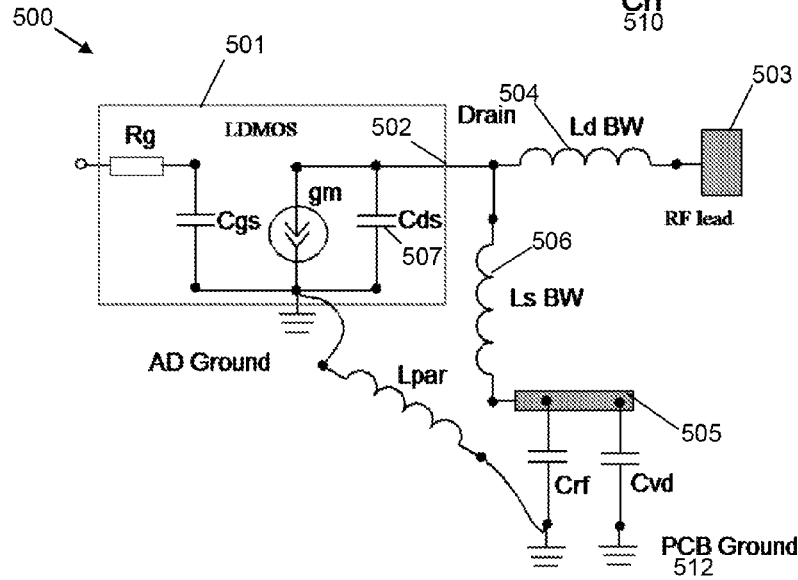
Figure 5C:
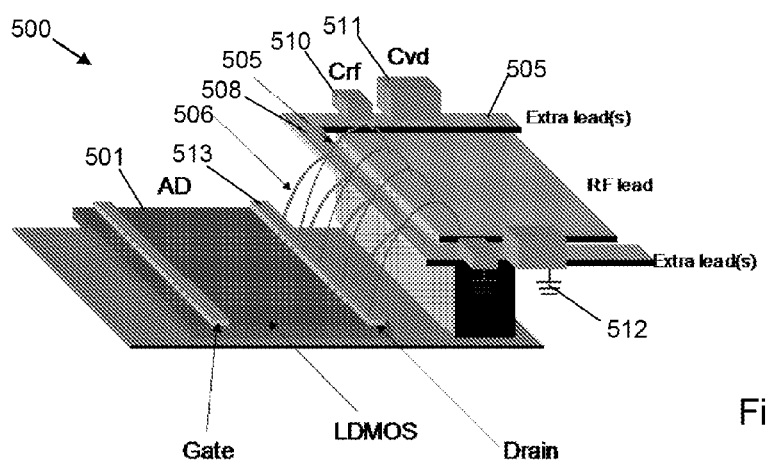

A first exemplary embodiment of a radiofrequency amplifier 500 in accordance with the invention is illustrated in FIGS. 5a, 5b and 5c. FIG. 5a illustrates a schematic sectional view of the amplifier, FIG. 5b a schematic circuit diagram of the amplifier 500 and FIG. 5c a perspective view of the physical arrangement of the amplifier 500. Each of these diagrams show an active device AD 501 having an output 502 connected to a first RF output lead 503 via a first bond wire Ld BW 504, and to a second output lead 505 via a second bond wire Ls BW 506, each bond wire providing an inductance between the amplifier output 502 and the output leads 503, 505. In this illustrated embodiment the output 502 of the active device 501 is the drain connection of the active device 501.

This implementation is similar to known post matching circuits for RF power amplifiers in which a built-in shunt inductance (or 'inshin') is used to cancel the output capacitance Cds 507 of the amplifier element in the active device 501. The main difference in this case is that the shunt inductance is partly provided outside of the active device package, due to the difficulty in creating the higher inductances required for low frequency matching based on the inductance of bond wires alone. Together with the inductance provided by bond wire Ls BW 506, the shunt inductance is partly or mainly provided by the inductance of the second output lead 505 within the package, together with the inductance of a PCB transmission line outside of the package. The second output lead 505 is in the form of a metal strip adjacent the first output RF lead 503. As shown in FIG. 5c, the second output lead 505 forms a c-shaped or h-shaped metal strip partially surrounding the first output RF lead 503.

A DC blocking capacitor Crf 510 and a video decoupling capacitor Cvd 511 are provided in the form of surface mount devices outside of the amplifier package. One side of each of the capacitors 510, 511 is connected to the second output lead 505 while the other side is connected to a ground connection 512 of the PCB.

As shown in FIG. 5c, a plurality of bond wires 506 connect the drain bond bar 513 of the LDMOS active die 501 with the second output lead 505. Another plurality of bond wires 505 connect the drain bond bar 513 with the first output RF lead of the package. In FIG. 5b, the inductance Lpar represents a parasitic inductance that is created by the physical separation of ground connections presented by the PCB and the active device 501.

In a general aspect therefore, in the first embodiment of the invention a shunt inductance is created by a combination of the inductance of a plurality of bond wires connecting the output of the active device with the second output lead, the inductance of a metal strip forming the second output lead and the inductance of a transmission line provided on the PCB on which the amplifier is mounted.

Compared with the type of output circuit configuration disclosed in U.S. Pat. No. 7,119,623, the circuit configuration of FIGS. 5a-5c allows for a substantially reduced size of device package for a similar output power level, because the required inductance inside the package is minimal. Compared with typical prior circuits requiring a space of around 4-6 mm within the package, circuit configurations according to those disclosed herein may be designed with an internal package space of only 0.4 mm without compromising the power capability of the device.

Second Embodiment

Figure 6A:
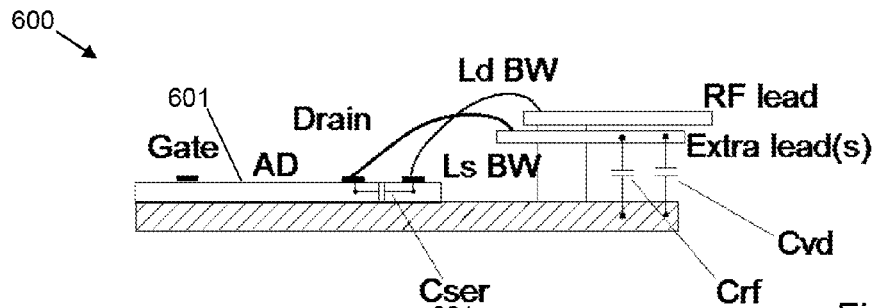
FIGS. 6a, 6b and 6c illustrate an exemplary second embodiment of an amplifier in schematic sectional, circuit diagram and perspective views respectively.
Figure 6B:
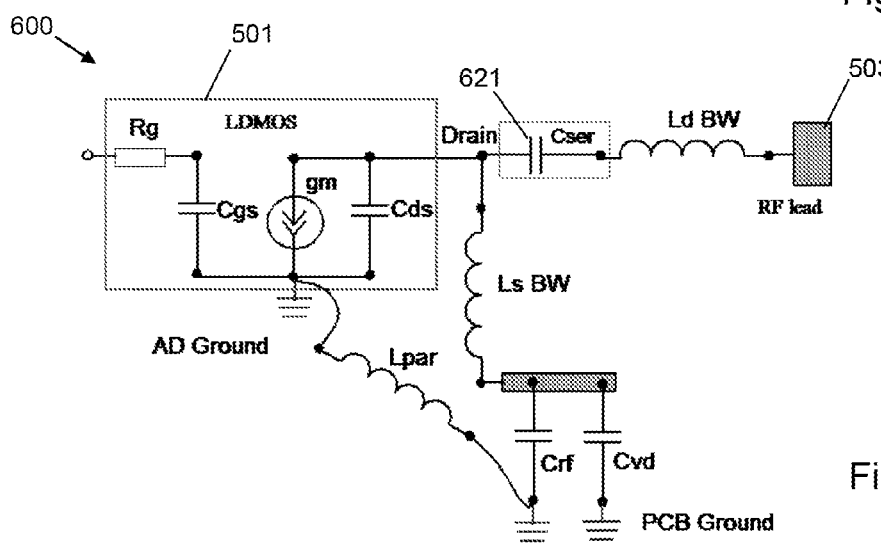
Figure 6C:
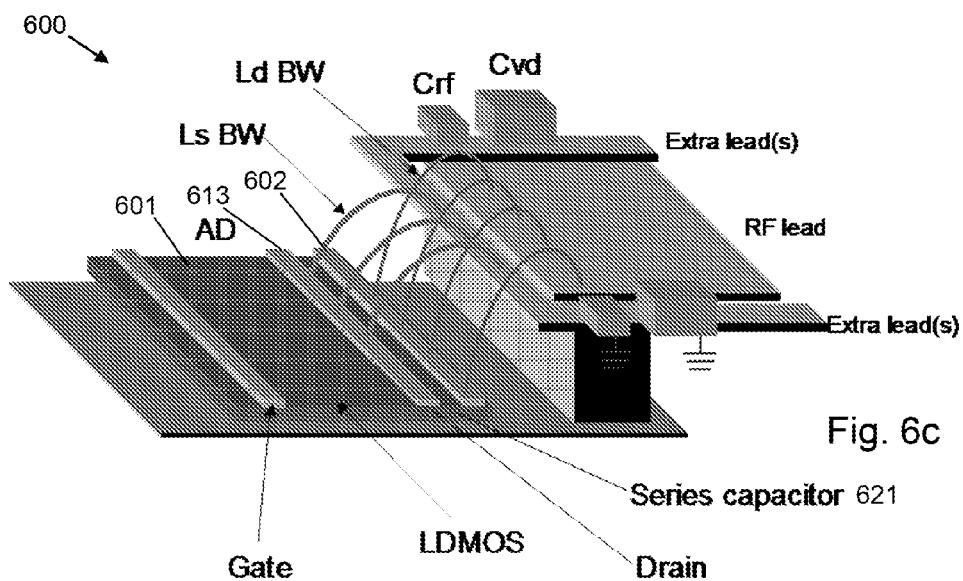

A second embodiment of a radiofrequency amplifier 600 in accordance with the invention is illustrated in FIGS. 6a, 6b and 6c. FIG. 6a illustrates a schematic sectional view of the amplifier 600, FIG. 6*b* a schematic circuit diagram and FIG. 6*c* a general perspective view of the physical arrangement of the amplifier 600.

The main difference with respect to the first embodiment described above and illustrated in FIGS. 5*a*-5*c* is the addition of a series capacitor Cser 621 to the output of the active device 501 (601 in FIGS. 6*a* and 6*c*). All other components of the amplifier 600 are otherwise as described above in relation to the first embodiment. The series capacitor 621 can be provided either on the active device 601 as part of the output as shown in FIGS. 6*a* and 6*c* or, as shown in FIG. 6*b*, on a separate die. The series capacitor 621 acts to compensate for the inductance of the first output RF lead 503. This is particularly advantageous for so-called "gull wing" packages, where the inductance of the RF output lead can be significant. In addition, the series capacitance 621 contributes to the required impedance transformation on the PCB.

Figure 7:
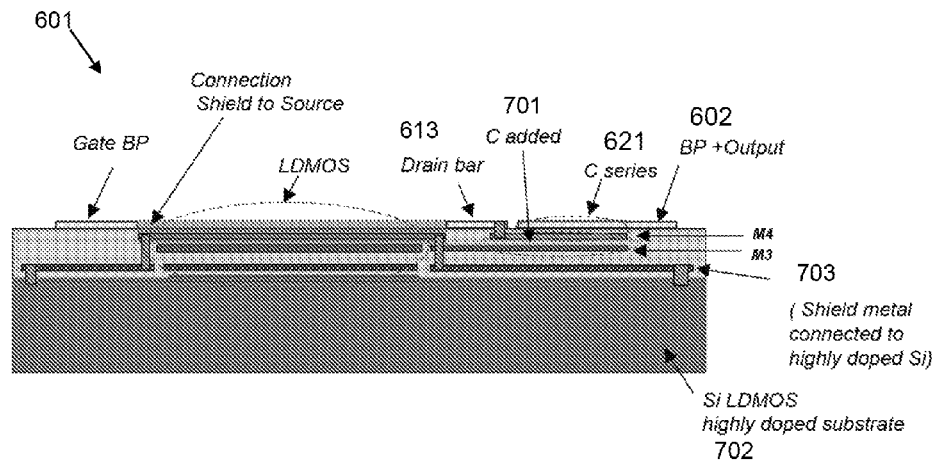
FIG. 7 is a schematic cross-sectional diagram of an active device for use with the amplifier according to certain embodiments of the invention.

A possible implementation of the series capacitance Cser 621 as part of the active die 601 is illustrated in the sectional schematic diagram of FIG. 7. The series capacitance 621 is connected between the drain bar 613 and a separate output bar 602 of the active die 601. A parallel capacitance 701 is also provided between the drain bar 613 and ground, provided by the underlying doped substrate 702 and connected via a shield layer 703.

In a general aspect therefore, in the second embodiment of the invention, in addition to the features of the first embodiment a series capacitor is provided at the active device output, the series capacitor provided either within the active device die between a drain bar and a separate output bar of the active device or as part of a separate die mounted on the substrate adjacent the active device.

Third Embodiment

The amplifiers of either the first or second embodiments can be further improved through the use of a special transmission line instead of through the simple metal strip forming the second output lead of the first and second embodiments.

Figure 8:
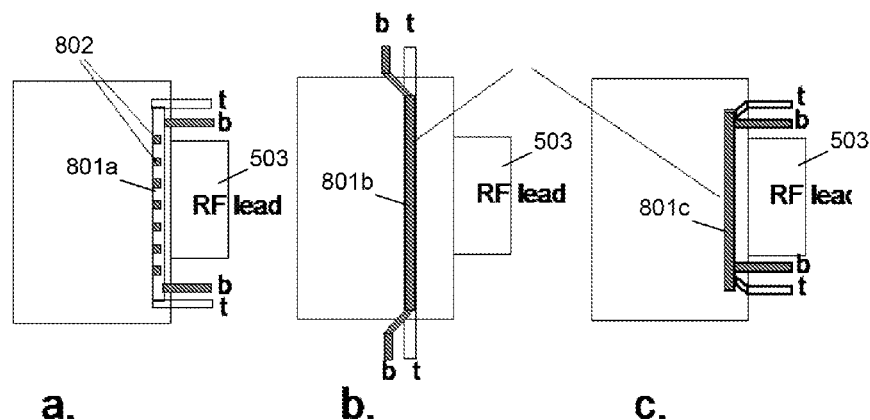
FIGS. 8a, 8b and 8c are schematic plan views of alternative transmission lines provided between an RF output lead and an output of an active device.

At frequencies close to 1 Ghz the inductance introduced by extra leads and the PCB can reach values which are not usable for post match and video decoupling, due to the value of the parasitic inductance between the ground connections of the PCB and the active die (as described above in relation to FIG. 5*b*). In order to minimize this parasitic inductance, a special transmission line may be used instead of the simple metal strip inside the amplifier package. Exemplary embodiments of such transmission lines are illustrated in FIGS. 8 and 9. FIG. 8 shows a series of plan views of three variations of a transmission line 801*a*, 801*b*, 801*c* based on a modified version of the second output lead of the first and second embodiments. The modified second output lead of the package comprises a pair of leads forming each side of the transmission line, indicated in FIG. 8 as a top lead t and a bottom lead b. The leads t, b may extend from the package either on the same side as the first output RF lead 503, as shown in FIGS. 8*a* and 8*c*, or on orthogonal sides of the RF lead 503, as shown in FIG. 8*b*. The bottom lead may be accessed via openings 802 in the top lead t for bond wire connections to be made, as indicated in FIG. 8*a*.

Figure 9A:
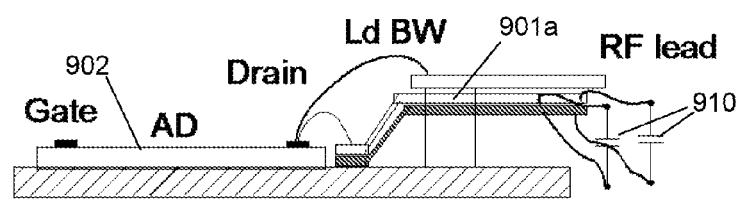
FIGS. 9a, 9b and 9c are schematic sectional views of alternative forms of transmission lines provided between an RF output lead and an output of an active device.
Figure 9B:
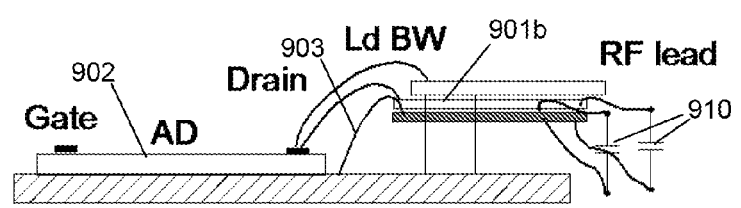
Figure 9C:
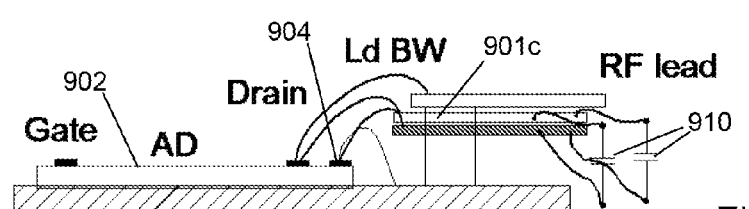

One side of the transmission line is preferably grounded at a point close to the active device die ground connection, for example by being soldered/glued or grounded via bond wires, in order to reduce any parasitic inductances. This is indicated in the schematic sectional views of FIGS. 9*a*-9*c*. In FIG. 9*a*, the bottom part of the transmission line 901*a* is soldered or glued to provide a ground connection adjacent the active die 902. In FIG. 9*b*, the bottom part of the transmission line 901*b* is connected to ground via one or more bond wires 903. In FIG. 9*c*, the bottom part of the transmission line 901*c* is connected to a ground connection via a bond pad 904 on the active die 902.

In the embodiments where a transmission line is used as part of the amplifier device package, external surface mount components such as capacitors 910 are connected to the transmission line 901*a*-*c* instead of to a PCB ground connection as in the first and second embodiments.

In place of a transmission line, a coaxial cable may be used.

In a general aspect therefore, according to a third embodiment of the invention, in place of the metal strip partially surrounding the first output RF lead, a transmission line is provided between the first output RF lead and the output of the active device. The transmission line comprises a pair of parallel conductors, a first conductor being connected to a ground connection at or proximate the active device and a second conductor being connected to the output of the active device. The first conductor may be connected to the ground connection by means of a soldered or glued connection, or by means of bond wire connections either directly or via one or more bond pads on the active device.

A low inductance transmission line for use in the amplifier according to the third embodiment may be provided by two or more conducting surfaces separated by one or more thin dielectric layers, which creates a distributed LC system with a low inductance. The bottom plate is grounded at a point closest to the active device die. External capacitors and a DC supply are connected to the bottom and top sides of the transmission line towards another end of the transmission line.

Figure 10A:
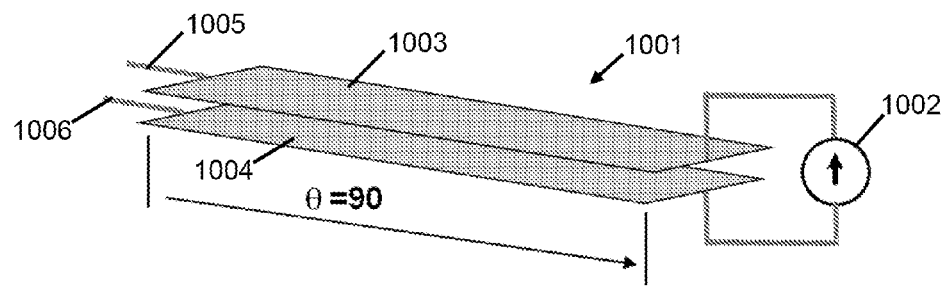
FIGS. 10a, 10b and 10c are representations of exemplary transmission lines.
Figure 10B:
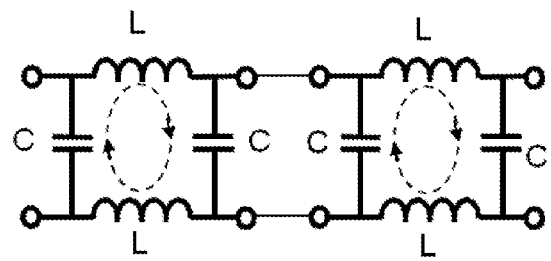

FIG. 10*a* illustrates in schematic form an exemplary transmission line 1001. The transmission line 1001 is connected to a power supply 1002 and provides output connections 1005, 1006 for being connected to the drain and supply connections of an active device die. The transmission line 1001 is in the form of a pair of parallel conductive plates 1003, 1004, which are represented in the schematic circuit diagram of FIG. 10*b* by pairs of parallel inductors connected in series, with capacitance connections therebetween. The parallel inductances are also shown in FIG. 10*b* as being magnetically coupled. The circuit diagram of FIG. 10*b* also represents the electrical characteristics of a coaxial cable.

Figure 10C:
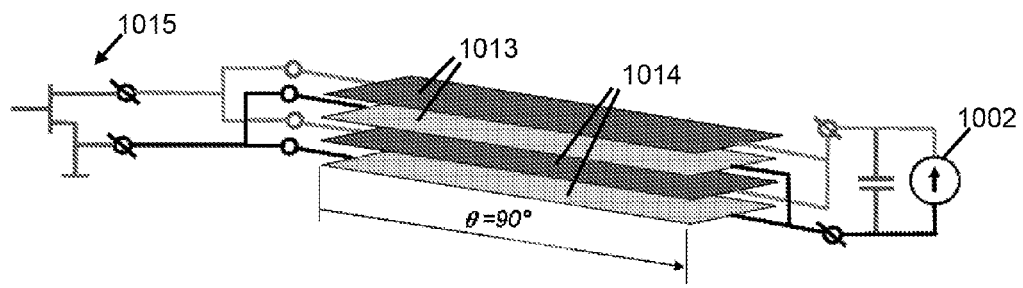

FIG. 10*c* illustrates a further exemplary embodiment of a supply transmission line, in which multiple pairs 1013, 1014 of conductors are arranged in a stack. This arrangement provides for a low equivalent inductance due to a stronger negative magnetic coupling between adjacent conductors of the stack. This reduces the inductive impedance of the transmission line and allows for a faster variation of current to flow through the line between the power supply 1002 and the amplifier device 1015.

Figure 11:
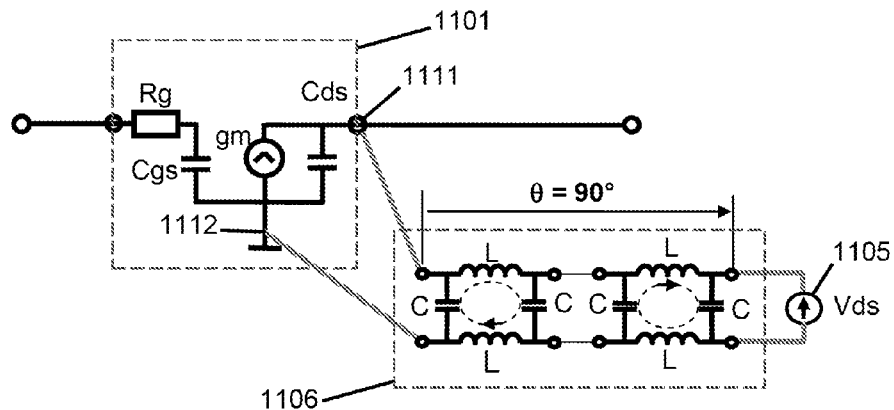
FIG. 11 is a schematic circuit diagram of an active device supplied with a power supply voltage via a transmission line.

An equivalent circuit of an active device 1101 provided with a DC supply via a low inductance transmission line 1106 is illustrated in FIG. 11. The ground side of the DC supply 1105 is connected to the bottom side of the transmission line 1106. The transmission line 1106 is shown connected directly to a drain terminal 1111 and a source terminal 1112 of the active device die 1101.

Figure 12:
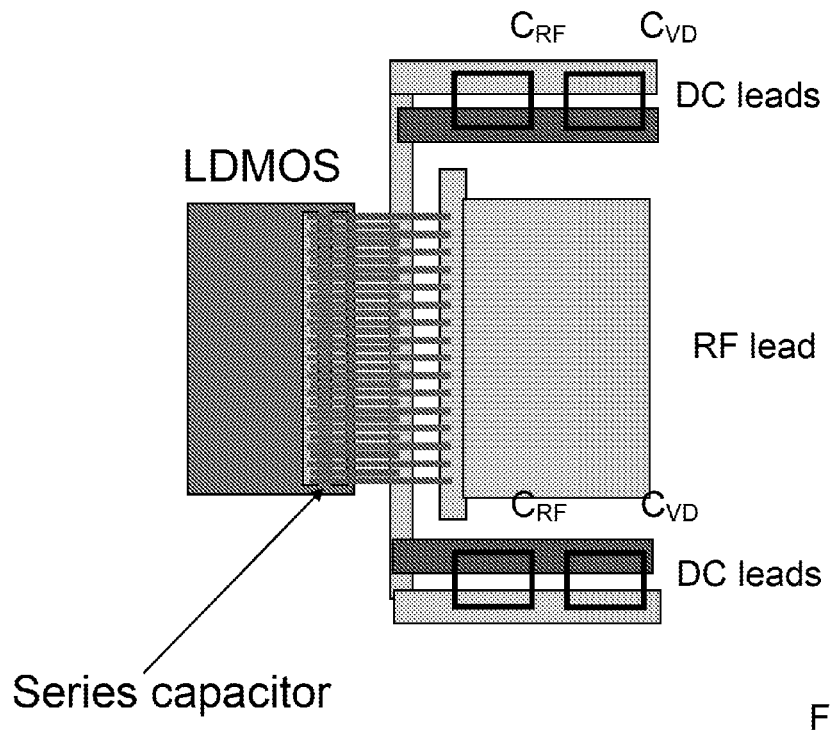
FIG. 12 is a schematic plan view of an exemplary output circuit layout comprising a transmission line.
Figure 13:
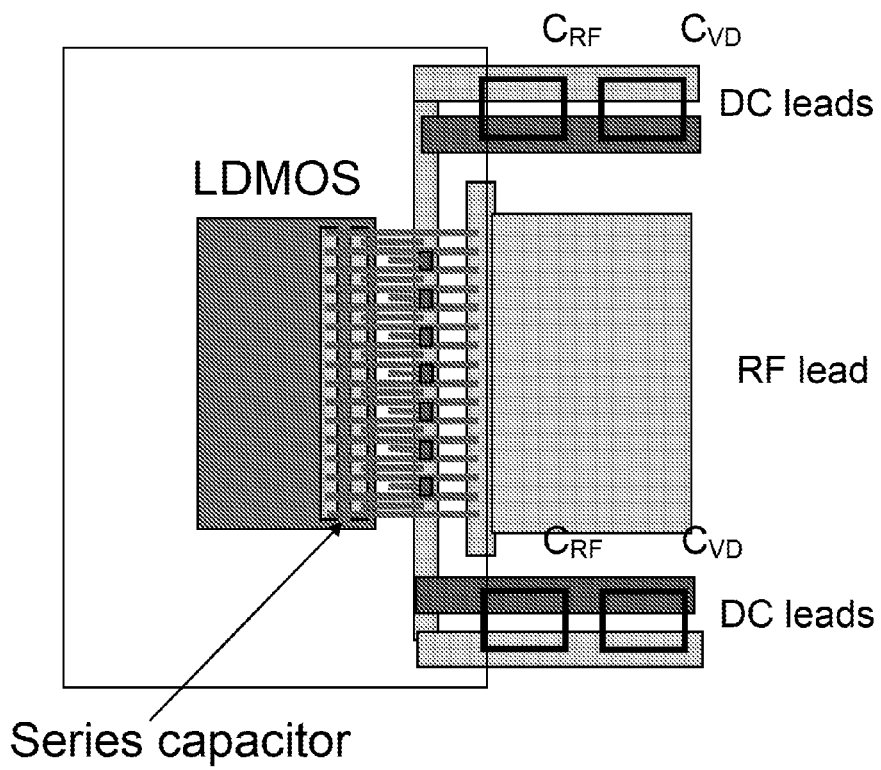
FIG. 13 is a schematic plan view of an alternative exemplary output circuit layout comprising a transmission line.

FIGS. 12 and 13 show general plan views of post-match circuits comprising low inductance transmission lines for RF prematch, DC bias feed and videodecoupling, the transmission line in FIG. 13 having openings in the top conductor to allow bond wire connections to be made to the bottom conductor, as in FIG. 8*a*, while the transmission line in FIG. 12 has a soldered connections to the flange of the amplifier package.

Figure 14A:
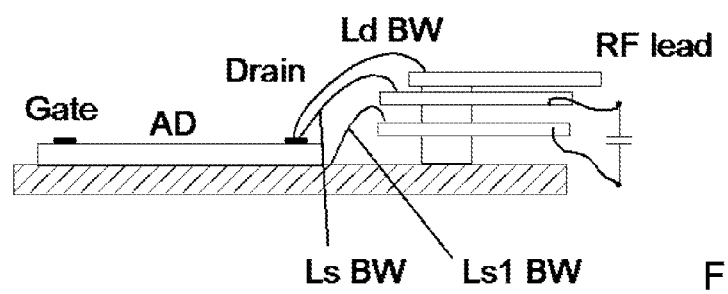
FIGS. 14a and 14b are schematic sectional and circuit diagrams of modified versions of the first embodiment.
Figure 14B:
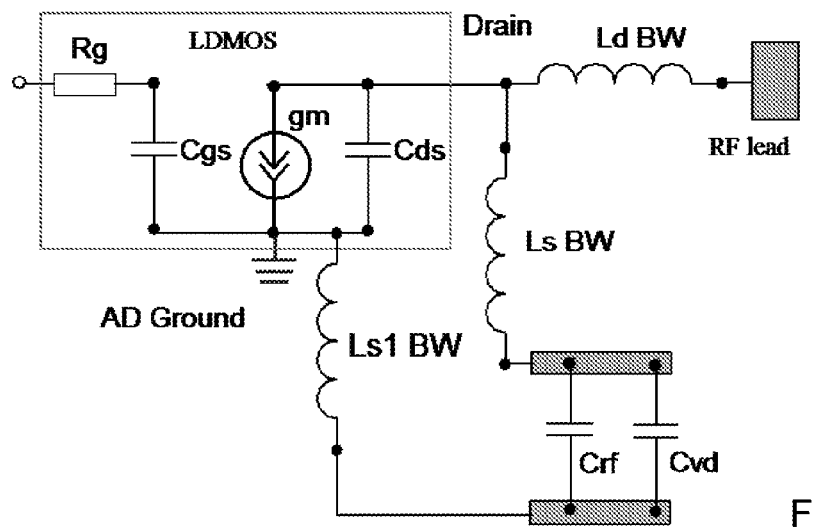
Figure 15A:
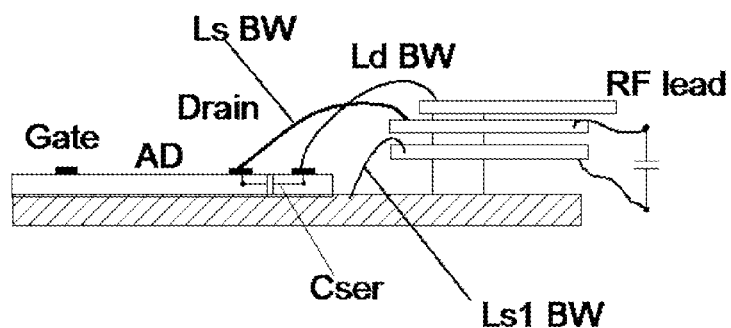
FIGS. 15a and 15b are schematic sectional and circuit diagrams of modified versions of the second embodiment.
Figure 15B:
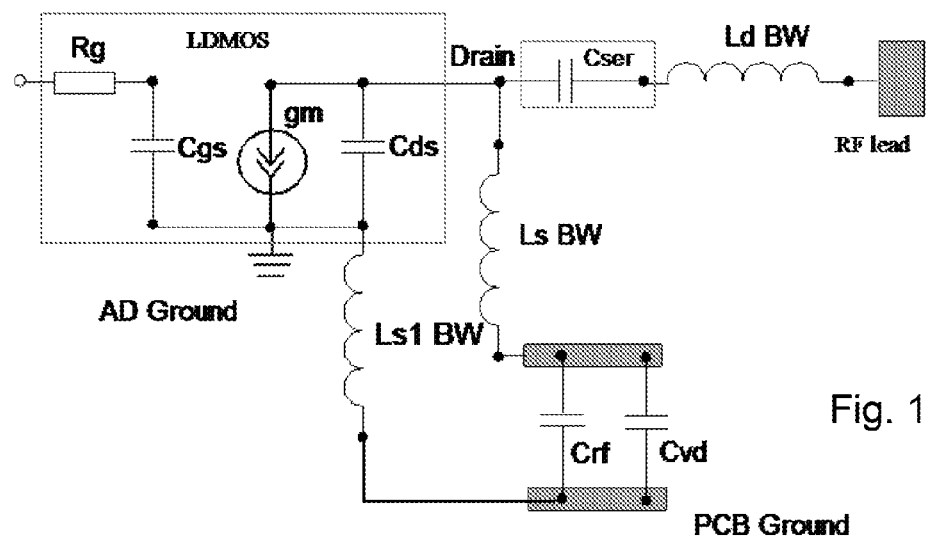

FIGS. 14a and 14b illustrate schematic sectional and circuit diagrams respectively of modified versions of an amplifier according to the first embodiment, in which a transmission line is used in place of the metal strip of the first embodiment. Similarly, FIGS. 15a and 15b illustrate schematic sectional and circuit diagrams respectively of modified versions of an amplifier according to the second embodiment.

Fourth Embodiment

Figure 16A:
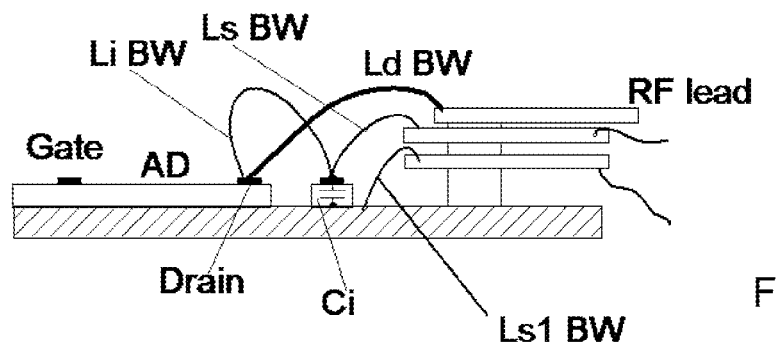
FIGS. 16a, 16b and 16c illustrate an exemplary fourth embodiment of an amplifier in schematic sectional, circuit diagram and perspective views respectively.
Figure 16B:
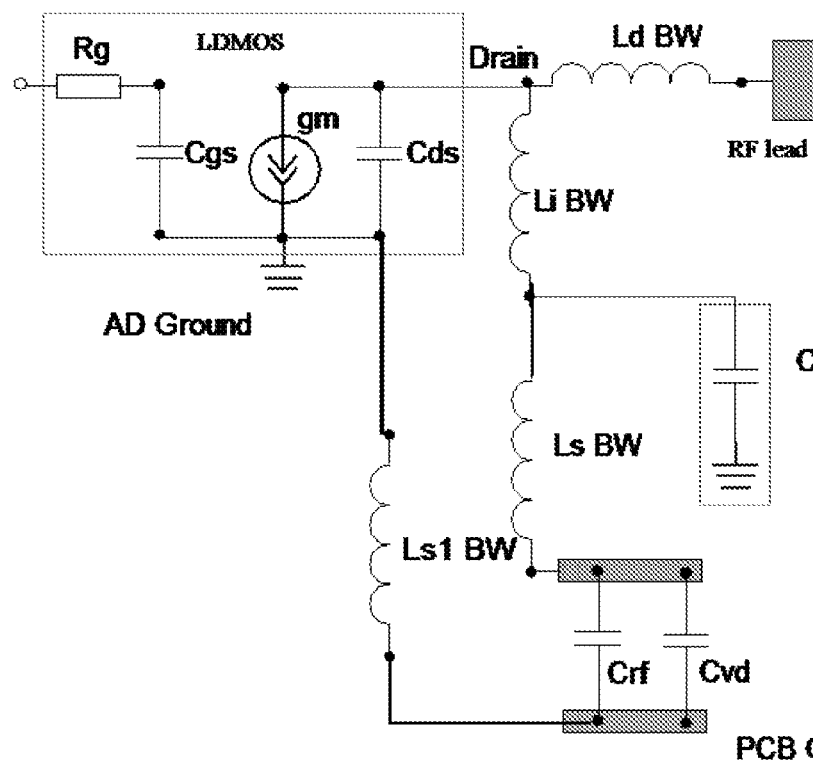
Figure 16C:
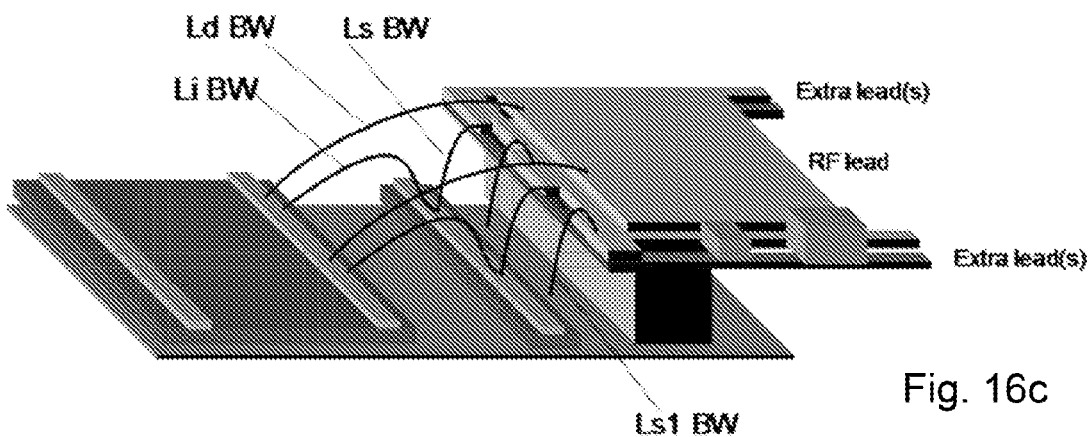

FIGS. 16a, 16b and 16c illustrate in schematic sectional, circuit diagram and general perspective views respectively an amplifier 1600 according to a fourth embodiment of the invention. As with the third embodiment and the modified first and second embodiments, the amplifier 1600 comprises a transmission line forming part of the second output lead. In addition, a separate die is provided between the active device die and the second output lead transmission line, the separate die comprising a further capacitance Ci.

Fifth Embodiment

Figure 17A:
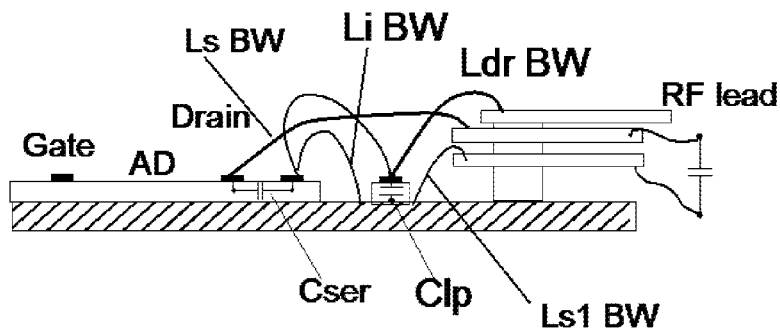
FIGS. 17a, 17b and 17c illustrate an exemplary fifth embodiment of an amplifier in schematic sectional, circuit diagram and perspective views respectively.
Figure 17B:
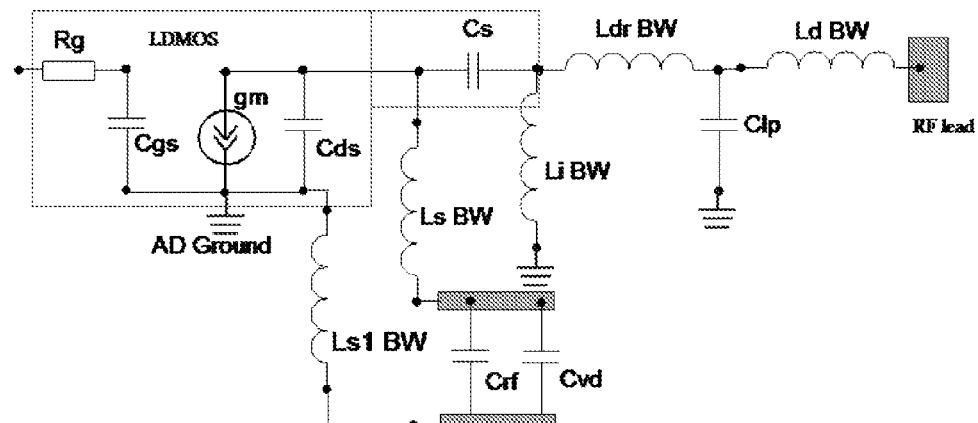
Figure 17C:
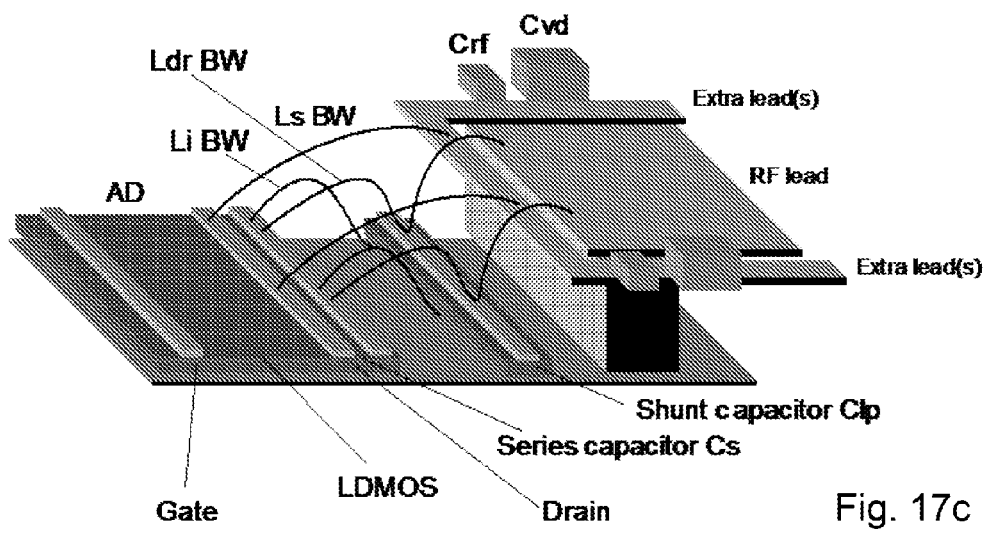

FIGS. 17a, 17b and 17c illustrate in schematic sectional, circuit diagram and general perspective views respectively an amplifier 1700 according to a fifth embodiment of the invention. In this implementation additional transformation steps provided by bond wire inductors Li BW and Ldr BW connect the output of the active device die to the transmission line of the second output lead via a separate die comprising a capacitance Clp in order to improve the impedance level.

In a general aspect, according to the fifth embodiment the shunt inductance comprises bond wires connecting the output of the active die to the second output lead via a separate die comprising a capacitance.

Sixth Embodiment

Figure 18A:
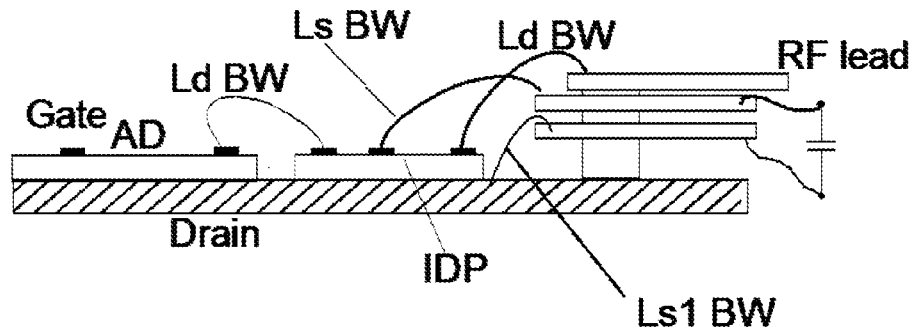
FIGS. 18a, 18b and 18c illustrate an exemplary sixth embodiment of an amplifier in schematic sectional, circuit diagram and perspective views respectively.
Figure 18B:
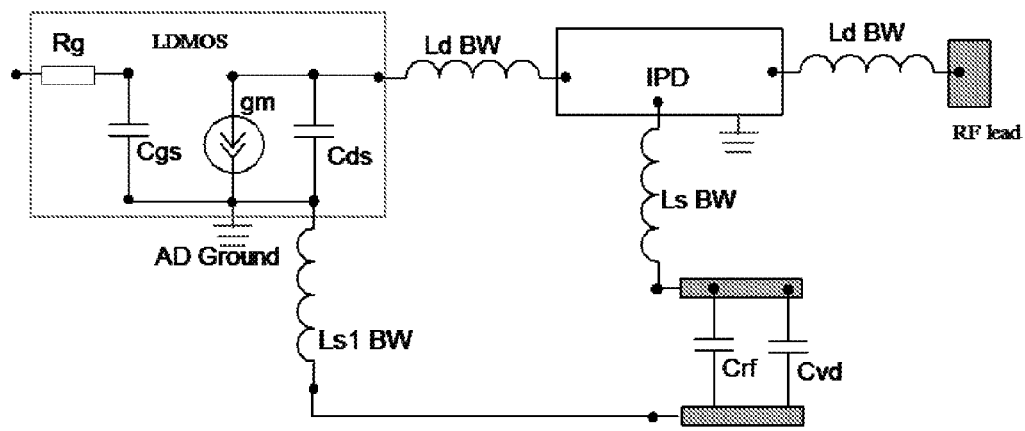
Figure 18C:
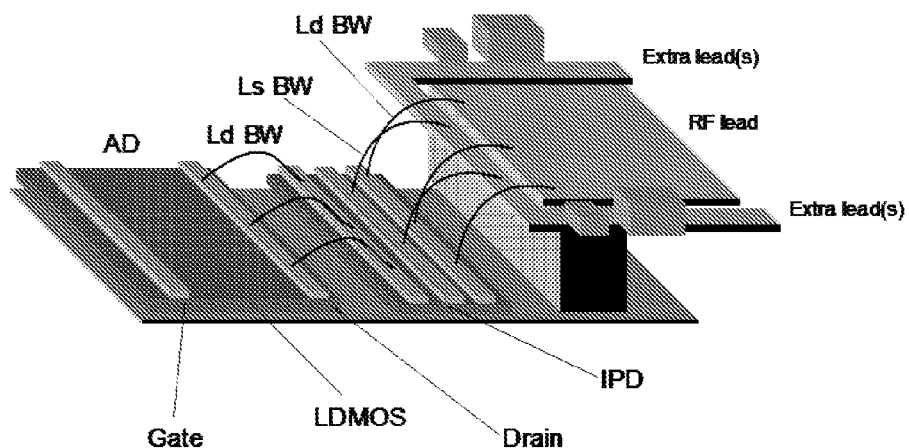

FIGS. 18a, 18b and 18c illustrate in schematic sectional, circuit diagram and general perspective views respectively an amplifier 1800 according to a sixth embodiment of the invention. In this embodiment, passive integrated devices (IPD) and discrete components (such as printed circuit inductors, shunt and series capacitors or resistors) can be combined on one separate die. Impedance transformation for video decoupling and/or a DC supply are made via external transmission lines or coaxial cable.

Other embodiments are also within the scope of the invention, which is defined by the appended claims.

The invention claimed is:

1. A radiofrequency amplifier comprising: an active device mounted on a substrate within a device package, the amplifier having an output impedance matching network comprising a high pass network provided at least partly on the active device and a low pass network having an inductance and comprising a first inductive shunt connection between an output of the active device and a first output lead and a second inductive shunt connection between the output of the active device and a second output lead, wherein a portion of the second output lead forms an inductance contributing to the inductance of the low pass network.

2. The radiofrequency amplifier of claim 1, wherein a shunt inductance is provided by a combination of:
 i) an inductance of a plurality of bond wires connecting the output of the active device with the second output lead;
 ii) an inductance of a metal strip forming the second output lead; and
 iii) an inductance of a transmission line provided on a PCB to which the amplifier is mounted.

3. The radiofrequency amplifier of claim 1, wherein the second output lead comprises a transmission line disposed between the first output lead and the output of the active device.

4. The radiofrequency amplifier of claim 3 wherein the transmission line comprises a pair of parallel conductors, with a first conductor connected to a ground connection at or proximate the active device and a second conductor connected to the output of the active device.

5. The radiofrequency amplifier of claim 4 wherein the first conductor is connected to the ground connection by a connection that is soldered or glued, or by bond wire connections directly to ground, or via at least one bond pad on the active device.

6. The radiofrequency amplifier of claim 4 wherein the second conductor is connected to the output of the active device by a plurality of bond wires connecting to the second conductor through openings in the first conductor.

7. The radiofrequency amplifier of claim 1, further comprising a series capacitor connected between an output connection and a drain connection of the active device.

8. The radiofrequency amplifier of claim 1, further comprising a series capacitor connected to the output of the active device, the series capacitor being part of a separate die on the substrate adjacent to the active device.

* * * * *